United States Patent
Inaura et al.

(10) Patent No.: US 11,997,375 B2
(45) Date of Patent: May 28, 2024

(54) IMAGE CORRECTION METHOD, IMAGING DEVICE, AND INSPECTION DEVICE

(71) Applicant: FUJI CORPORATION, Chiryu (JP)

(72) Inventors: Yuki Inaura, Chiryu (JP); Shuichiro Kito, Toyota (JP); Yuta Yokoi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 102 days.

(21) Appl. No.: 17/904,815

(22) PCT Filed: Feb. 27, 2020

(86) PCT No.: PCT/JP2020/008044
§ 371 (c)(1),
(2) Date: Aug. 23, 2022

(87) PCT Pub. No.: WO2021/171487
PCT Pub. Date: Sep. 2, 2021

(65) Prior Publication Data
US 2023/0116070 A1 Apr. 13, 2023

(51) Int. Cl.
*H04N 23/56* (2023.01)
*H04N 23/10* (2023.01)
(Continued)

(52) U.S. Cl.
CPC ............ *H04N 23/56* (2023.01); *H04N 23/10* (2023.01); *H04N 23/88* (2023.01); *H04N 25/611* (2023.01)

(58) Field of Classification Search
CPC .......... H04N 23/88; H04N 23/56; H04N 1/58; H04N 23/125; H04N 23/55; H04N 23/60;
(Continued)

(56) References Cited

U.S. PATENT DOCUMENTS

| 6,097,430 A | * | 8/2000 | Komiya | ............... H04N 5/2624 |
| | | | | 348/E5.053 |
| 7,319,529 B2 | * | 1/2008 | Babayoff | .................. G01J 3/02 |
| | | | | 348/E13.005 |

(Continued)

FOREIGN PATENT DOCUMENTS

WO    WO 2019/111331 A1    6/2019

OTHER PUBLICATIONS

Michio Kise et al., "Multispectral imaging system with interchangeable filter design", Computers and Electronics in Agriculture, 72 (2010), pp. 61-68.
(Continued)

*Primary Examiner* — Abdelaaziz Tissire
(74) *Attorney, Agent, or Firm* — Oblon, McClelland, Maier & Neustadt, L.L.P.

(57) ABSTRACT

An image correction method for correcting multiple original images captured under illumination by multiple different light source colors in generating a composite image by superposing the original images, includes obtaining a correction amount for correcting a position of a fiducial mark recognized from a reference image of a specific light source color in reference images of the multiple different light source colors; obtaining correction amounts for correcting positions of the fiducial mark recognized from the reference images of other light source colors than a specific light source color to the reference position in the reference image of the specific light source color; and when the original images are captured, correcting collectively distortion aberration and chromatic aberration of the original images of the multiple different light source colors using the correction amounts associated with the multiple different light source colors.

4 Claims, 7 Drawing Sheets

(51) Int. Cl.
*H04N 23/88* (2023.01)
*H04N 25/611* (2023.01)

(58) Field of Classification Search
CPC .... H04N 17/002; H04N 23/10; H04N 1/6027; H04N 25/611; H05K 13/0812; G06T 2207/30204; G06T 2207/10016; G06T 7/74; G06T 7/0004; G06T 7/001; G06T 2207/10152; G06T 5/80
See application file for complete search history.

(56) References Cited

U.S. PATENT DOCUMENTS

| | | | |
|---|---|---|---|
| 10,247,933 B2* | 4/2019 | Stoppe | G02B 21/367 |
| 11,350,063 B2* | 5/2022 | Wu | H04N 25/68 |
| 2004/0002016 A1* | 1/2004 | Rivers | H10K 71/18 |
| | | | 430/319 |
| 2017/0261741 A1* | 9/2017 | Stoppe | G06T 5/50 |
| 2020/0348582 A1* | 11/2020 | Kotani | H04N 23/56 |

OTHER PUBLICATIONS

International Search Report dated May 12, 2020 in PCT/JP2020/008044 filed on Feb. 27, 2020.

* cited by examiner

IMAGE CORRECTION METHOD, IMAGING DEVICE, AND INSPECTION DEVICE

TECHNICAL FIELD

The present description discloses an image correction method, an imaging device, and an inspection device.

BACKGROUND ART

Conventionally, as an imaging device of this type, there has been proposed an imaging device including multiple light sources for irradiating light rays of multiple colors, so that a subject is irradiated with a light ray emitted from any light source selected from the multiple light sources so as to be imaged (for example, refer to Patent Literature 1). With this imaging device, an appropriate value of resolution is selected or a chromatic aberration is corrected in accordance with a light source color of a selected light source.

PATENT LITERATURE

Patent Literature 1: International Publication No. WO2019/111331

BRIEF SUMMARY

Technical Problem

As described above, in the imaging device in which the multiple light sources can be used selectively, there is a case in which an identical subject is imaged separately multiple times corresponding the multiple light sources by being irradiated with the light rays emitted individually from the multiple light sources to obtain original images of the light source colors, and these original images are superposed and combined to thereby generate a color composite image in a pseudo manner. In this case, it is necessary to correct the distortion aberration and the chromatic aberration of the original images in order to suppress the deviation of the superposed original images from each other to thereby generate a composite image with high precision. However, since the original images are individually corrected using a correction amount of distortion aberration and a correction amount of chromatic aberration, some labor hours or time is required to make such a correction, thereby requiring a certain amount of time to generate a composite image.

A principal object of the present disclosure is to generate a composite image quickly by reducing the labor hours required to correct the distortion aberration and chromatic aberration of individual original images.

Solution to Problem

The present disclosure employs the following means in order to achieve the principal object described above.

To summarize, an image correction method of the present disclosure is an image correction method for correcting multiple original images captured under illumination by multiple different light source colors in generating a composite image by superposing the original images, the image correction method including: (a) a step of obtaining a correction amount for correcting a position of a fiducial mark recognized from a reference image of a specific light source color in reference images of the multiple different light source colors resulting from imaging a member on which the fiducial mark is provided under illumination by the multiple different light source colors to a reference position of the fiducial mark in the reference image of the specific light source color and setting the correction amount by associating the correction amount with the specific light source color; (b) obtaining correction amounts for correcting positions of the fiducial mark recognized from the reference images of other light source colors than the specific light source color to the reference position in the reference image of the specific light source color for the other light source colors and setting the correction amounts by associating the correction amounts with the other light source colors; and (c) when the original images are captured, correcting collectively distortion aberration and chromatic aberration of the original images of the multiple different light source colors using the correction amounts associated with the multiple different light source colors.

The image correction method of the present disclosure obtains the correction amount for correcting the position of the fiducial mark recognized from the reference image of the specific light source color to the reference position of the fiducial mark in the reference image of the specific light source color. Additionally, the image correction method obtains the correction amounts for correcting the positions of the fiducial mark recognized from the reference images of the other light source colors not to the reference positions of the fiducial mark in the reference images of the other light source colors but to the reference position of the fiducial mark in the reference image of the specific light source color. As a result, the correction amounts for collectively correct the distortion aberration and chromatic aberration can be set while associating them individually with the multiple different light source colors. Then, when the original images are captured, the distortion aberration and chromatic aberration of the original images are collectively corrected using the correction amounts associated individually with the multiple different light source colors. As a result, with the image correction method of the present disclosure, when compared with a case in which distortion aberration and chromatic aberration are corrected using respective correction amounts thereof, labor hours for correcting the distortion aberration and chromatic aberration of the original images can be mitigated to thereby generate a composite image without any delay.

DESCRIPTION OF EMBODIMENTS

Figure 1:
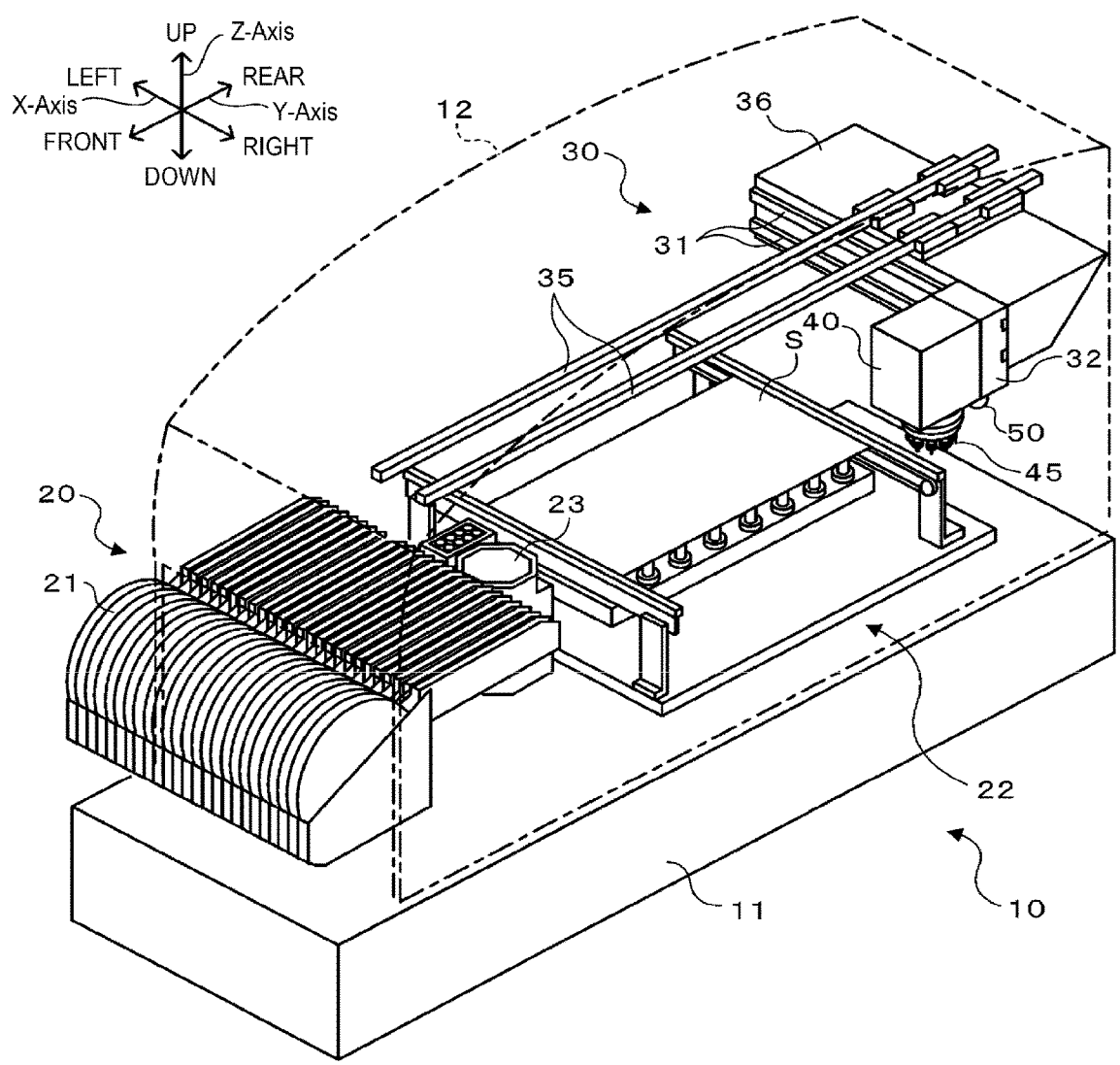
FIG. 1 A configuration diagram schematically showing a configuration of component mounter 10.
Figure 2:
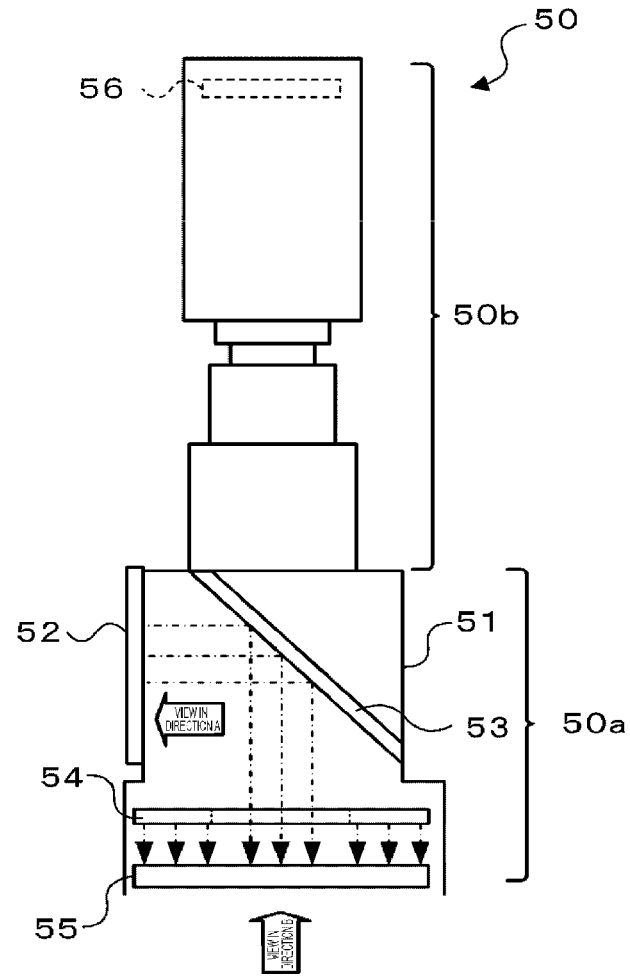
FIG. 2 A configuration diagram schematically showing a configuration of mark camera 50.
Figure 3:
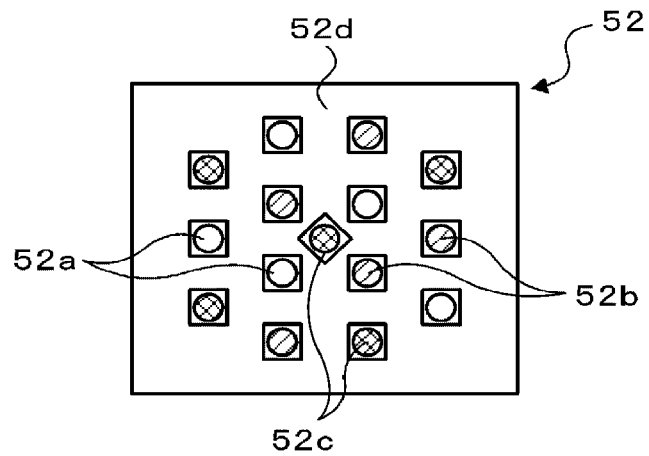
FIG. 3 A diagram showing epi-illuminating light source 52 as viewed in an direction indicated by an arrow A.
Figure 4:
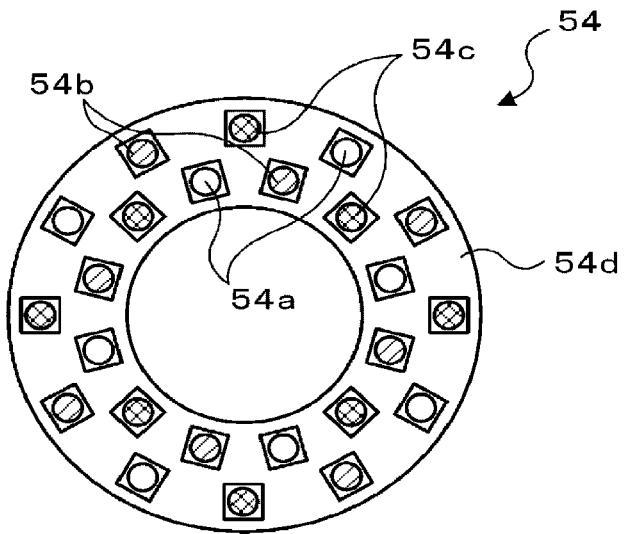
FIG. 4 A diagram showing side illuminating light source 54 as viewed in a direction indicated by an arrow B.
Figure 5:
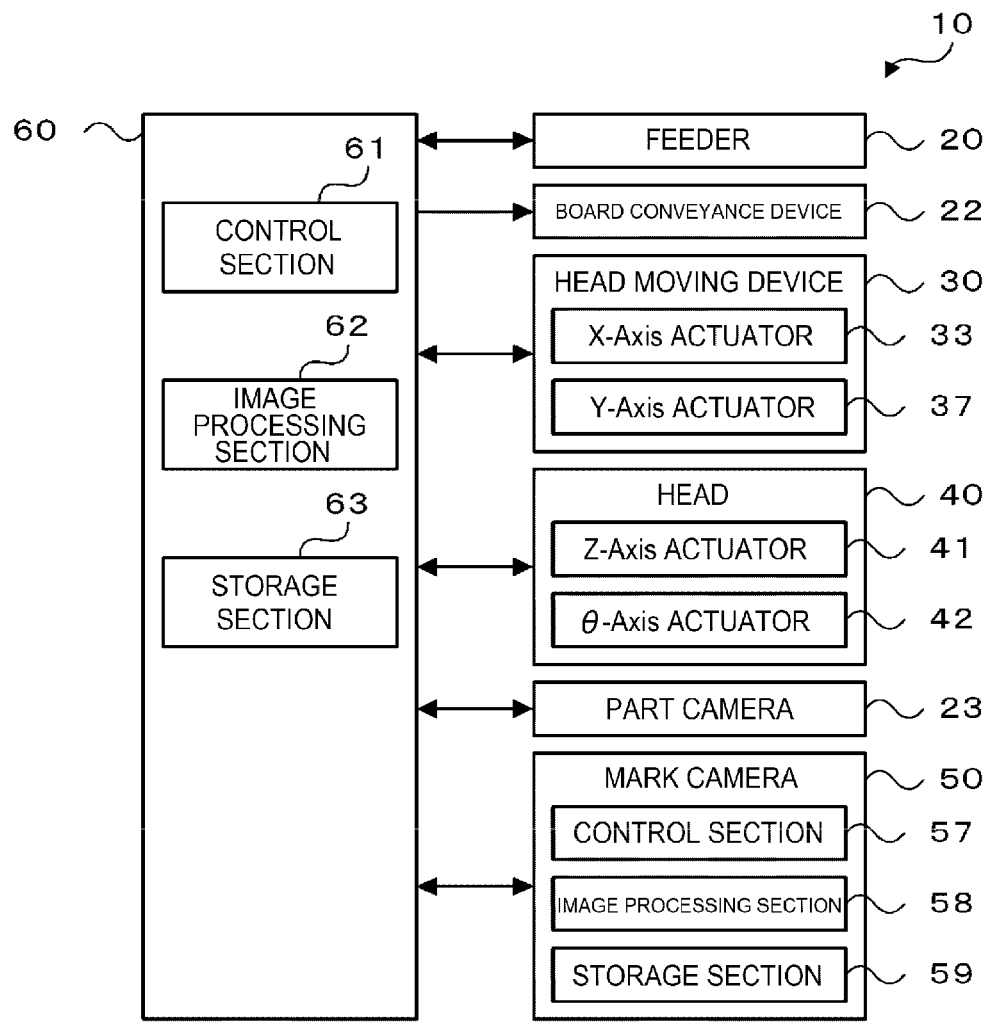
FIG. 5 A block diagram showing a configuration for control of component mounter 10.

Next, an embodiment of the present disclosure will be described. FIG. 1 is a configuration diagram schematically showing a configuration of component mounter 10 of the present embodiment. FIG. 2 is a configuration diagram schematically showing a configuration of mark camera 50. FIG. 3 is a diagram showing epi-illuminating light source 52 as viewed in a direction indicated by an arrow A. FIG. 4 is a diagram showing side illuminating light source 54 as viewed in a direction indicated by an arrow B. FIG. 5 is a block diagram showing a configuration for control of component mounter 10. In FIG. 1, a left-right direction denotes an X-axis direction, a front (near side)-rear (far side) direction denotes a Y-axis direction, and an up-down direction denotes a Z-axis direction. Multiple component mounters 10 are arranged side by side in a board conveyance direction (the X-axis direction) to make up a production line.

As shown in FIG. 1, component mounter 10 includes feeder 20, board conveyance device 22, head 40 having suction nozzle 45 for picking up a component, head moving device 30 for moving head 40, part camera 23, and mark camera 50. These constituent elements are accommodated in housing 12 placed on base plate 11. Feeder 20 is configured as a tape feeder configured to supply components by drawing a tape in which components are accommodated in accommodation sections which are formed at predetermined intervals on the tape from reel 21 and pitch feed the tape. Board conveyance device 22 includes a pair of conveyor rails, which are disposed in such a manner as to be spaced apart from each other in the Y-axis direction, to convey board S from the left to the right (the board conveyance direction) in FIG. 1 by driving the pair of conveyor rails.

Head 40 includes Z-axis actuator 41 (refer to FIG. 5) for moving suction nozzle 45 in the up-down direction (the Z-axis direction) and θ-axis actuator 42 (refer to FIG. 5) for moving suction nozzle 45 around the Z-axis. Head 40 causes suction nozzle 45 to pick up a component by letting a negative pressure source communicate with a suction port of suction nozzle 45 to apply a negative pressure to the suction port and to release the component that suction nozzle 45 picks up by letting a positive pressure source communicate with the suction port to apply a positive pressure to the suction port. Head moving device 30 includes X-axis slider 32 and Y-axis slider 36. X-axis slider 32 is supported by pair of upper and lower X-axis guide rails 31 provided on a front surface of Y-axis slider 36 in such a manner as to extend in the left-right direction (the X-axis direction), and moves in the left-right direction as X-axis actuator 33 (refer to FIG. 5) is driven accordingly. Y-axis slider 36 is supported by pair of left and right Y-axis guide rails 35 provided at an upper portion in housing 12 in such a manner as to extend in the front-rear direction (the Y-axis direction), and moves in the front-rear direction as Y-axis actuator 37 (refer to FIG. 5) is driven accordingly. Head 40 is attached to X-axis slider 32, and head 40 is allowed to move in XY directions by head moving device 30.

Part camera 23 is placed on base plate 11. Part camera 23 images a component picked up and held by suction nozzle 45 from below when the component so held by suction nozzle 45 passes over part camera 23 to thereby generate a captured image of the component and outputs the captured image so generated to control device 60.

Mark camera 50 is attached to X-axis slider 32 and is caused to move in the XY directions together with head 40 by head moving device 30 to image an imaging target object from above. Examples of imaging target objects include a component supplied by feeder 20, a mark affixed to board S, a component mounted on board S, and solder printed on circuit wirings (a copper foil) on board S. As shown in FIG. 2, mark camera 50 includes lighting section 50a and camera main body section 50b. Lighting section 50a includes housing 51, epi-illuminating light source 52, half mirror 53, side illuminating light source 54, and diffusion plate 55. Housing 51 is a cylindrical member opened in a lower surface and is attached to a lower end of camera main body section 50b.

Epi-illuminating light source 52 is provided on an inner side surface of housing 51. As shown in FIG. 3, epi-illuminating light source 52 is such that an equal number or substantially equal number of red LEDs 52a emitting monochromatic light of R (red), green LEDs 52b emitting monochromatic light of G (green), and blue LEDs 52c emitting monochromatic light of B (blue) are arranged into a quadrangular configuration on support plate 52d. Half mirror 53 is provided obliquely inside housing 51 to reflect downwards horizontal light rays from LEDs 52a, 52b, 52c of epi-illuminating light source 52. In addition, half mirror 53 transmits light from below towards camera main body section 50b. Side illuminating light source 54 is provided horizontally in the vicinity of a lower opening of housing 51. As shown in FIG. 4, side illuminating light source 54 is such that an equal or substantially equal number of red LEDs 54a, green LEDs 54b, and blue LEDs 54c are arranged into a ring-like configuration on support plate 54d and emits light downwards. Diffusion plate 55 is provided below side illuminating light source 54 in housing 51. Light rays emitted from epi-illuminating light source 52 and side illuminating light source 54 are diffused by diffusion plate 55 and then are irradiated to a target object. Mark camera 50 is capable of individually lighting the red light sources (red LEDs 52a and red LEDs 54a), green light sources (green LEDs 52b and green LEDs 54b), and blue light sources (blue LEDs 52c and blue LEDs 54c) of epi-illuminating light source 52 and side illuminating light source 54.

Camera main body section 50b includes an optical system such as a lens, not shown, and a monochrome CCD 56, for example, as a monochrome imaging element. When light emitted from epi-illuminating light source 52 and side illuminating light source 54 and then reflected on an imaging target object passes through half mirror 53 and reaches camera main body section 50b, camera main body section 50b receives the light at monochrome CCD 56 to generate a monochrome image. Respective wavelength regions of colors of R, G, B are not particularly limited, but, for example, R may be defined as ranging from 590 to 780 nm, G may be defined as ranging from 490 to 570 nm, and B may be defined as ranging from 400 to 490 nm. Additionally, camera main body section 50b includes CPU, ROM, RAM, EEPROM, and the like, which are not shown, and includes, as functional blocks, control section 57, image processing section 58, and storage section 59, as shown in FIG. 5. Control section 57 controls the whole of mark camera 50 including control of emission of light of each light source color from epi-illuminating light source 52 and side illuminating light source 54. Image processing section 58 performs image processing including various corrections on an image generated by monochrome CCD 56. Storage section 59 stores various process programs, image processing data, and the like. Storage section 59 stores correction amounts ΔRS, ΔGS, ΔBS, which will be described later, and the like as the image processing data.

Control device 60 includes CPU, ROM, RAM, HDD, and the like, which are not shown, and includes, as functional blocks, control section 61, image processing section 62, and storage section 63, as shown in FIG. 5. Control section 61 controls the whole of component mounter 10. Control section 61 outputs a control signal to board conveyance device 22, control signals to X-axis actuator 33 and Y-axis actuator 37, control signals to Z-axis actuator 41 and θ-axis actuator 42, a control signal to part camera 23, a control signal to mark camera 50, a control signal to feeder 20, and the like. An image from mark camera 50, an image from part camera 23, and the like are inputted into control section 61. Image processing section 62 processes images captured by mark camera 50 and part camera 23. Storage section 63 stores various process programs, various data, and the like.

Here, mark camera 50 images an imaging target object under illumination in which the red light sources, the green light sources, and the blue light sources of epi-illuminating light source 52 and side illuminating light source 54 are separately and independently illuminated or lit to generate three original images of R, G, and B (monochrome images) of the imaging target object. Three original images so generated are outputted to control device 60, and the three original images are superposed one on another to be combined together at image processing section 62, whereby a color image is generated. By generating a color image by superposing the three original images one on another, each pixel need not be allocated to each light source color as in the case of the Bayer layout for a color camera, and hence, although an imaging time becomes long, an imaging target object can be imaged without reducing the resolution. However, a chromatic aberration (a magnification chromatic aberration) is generated in which deviation tends to occur more towards the periphery of an image because different light source colors of light are brought to focus in different positions on an image plane. Therefore, not only distortion aberration resulting from the strain of a lens but also a chromatic aberration need be corrected in order to superpose the three original images of an imaging target object without any deviation. Storage section 59 of mark camera 50 stores correction amounts for correction of the distortion and chromatic aberrations.

Figure 6:
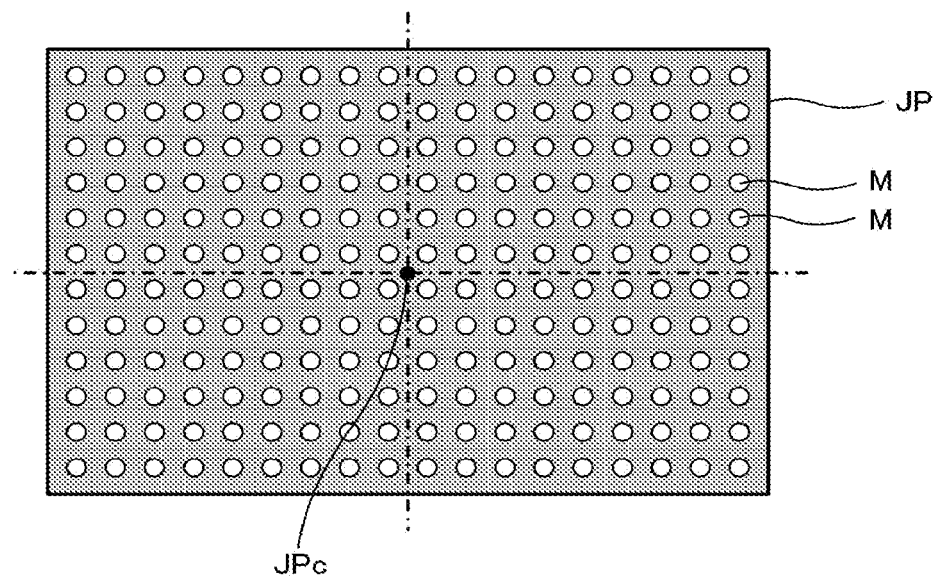
FIG. 6 An explanatory diagram showing an example of jig plate JP.

The correction amounts are normally set before mark camera 50 is assembled to component mounter 10, and are set, for example, from images captured in such a state that mark camera 50 is installed above a table on which jig plate JP is mounted. FIG. 6 is an explanatory diagram showing an example of jig plate JP. As shown therein, jig plate JP is a rectangular flat plate formed into a specified size, on which multiple fiducial marks M of a predetermined shape such as, for example a circular shape, are provided in a matrix configuration. Each fiducial mark M is provided in its ideal position which is determined with respect to center position JPc of jig plate JP in such a manner that a center of the mark is located in the ideal position.

Figure 7:
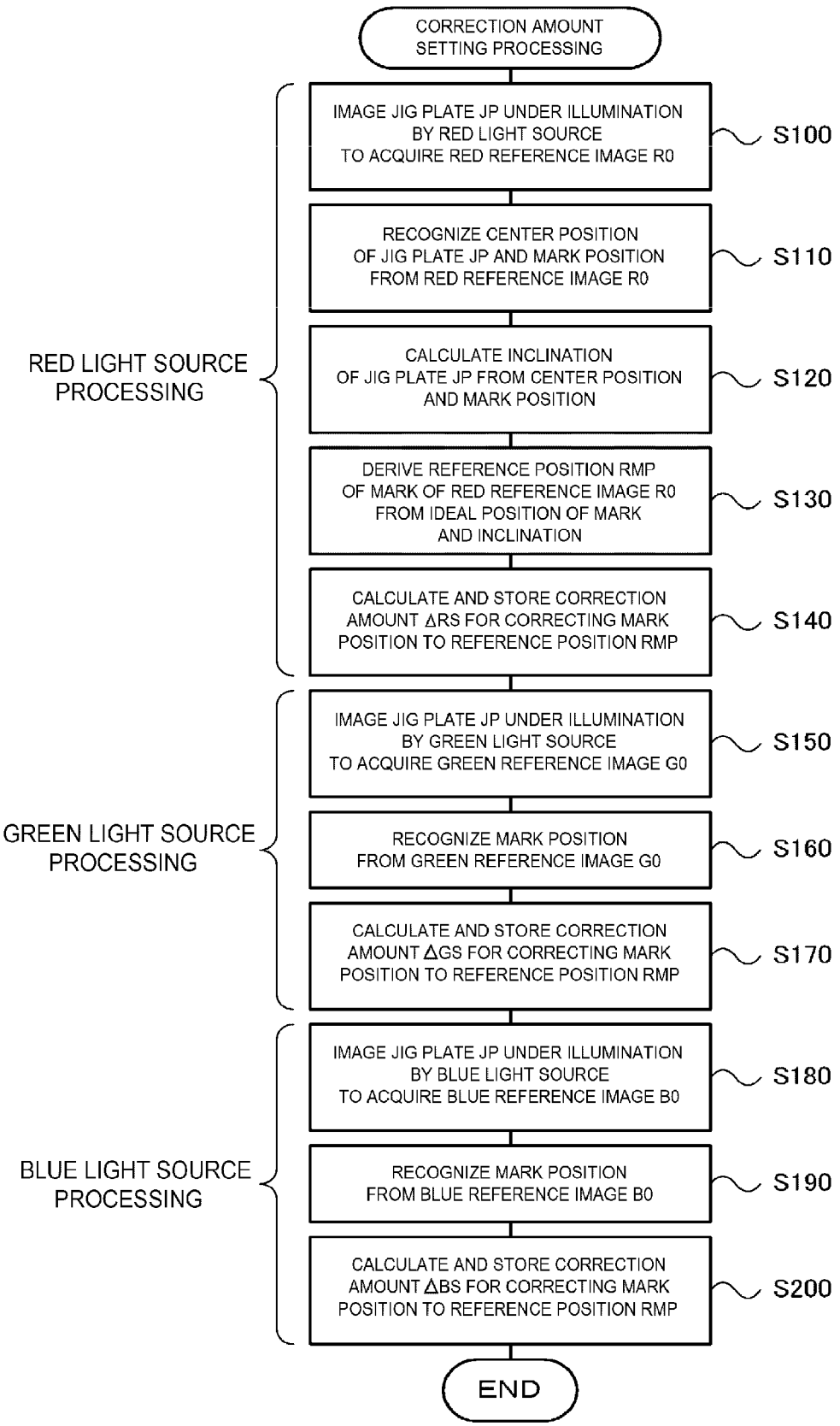
FIG. 7 A flowchart showing an example of correction amount setting processing.

FIG. 7 is a flowchart showing an example of correction amount setting processing. This processing is executed by control section 57 and image processing section 58 of mark camera 50. The processing executed by image processing section 58 may be executed by an image processing device which is made up of a general-purpose computer or the like. In correction amount setting processing, control section 57 first causes mark camera 50 to image jig plate JP under illumination by the red light source (LED 52 or LED 54a) to acquire red reference image R0 (S100). Subsequently, image processing section 58 recognizes center position JPc of jig plate JP and positions of individual fiducial marks M from red reference image R0 (S110). For example, image processing section 58 detects an area of jig plate JP and recognizes a center of the area as center position JPc. Additionally, image processing section 58 detects an area of each fiducial mark M and recognizes a center position of each area with respect to center position JPc as a position of each fiducial mark M.

Subsequently, image processing section 58 calculates an inclination of jig plate JP from center position JPc of jig plate JP and the positions of some fiducial marks M (S120). For example, by use of positions of multiple (for example, 4 or 12) fiducial marks M around center position JPc, image processing section 58 calculates an inclination of jig plate JP from positional deviations of those fiducial marks M with respect to center position JPc. The reason that fiducial marks M around center position JPc are used is that the influence of distortion aberration is less in the vicinity of center position JPc.

When it calculates an inclination of jig plate JP, image processing section 58 derives separately reference positions RMP of individual fiducial marks M in red reference image R0 from the ideal positions and inclinations of those fiducial marks M (S130). Reference position RMP is a position which reflects the inclination of the ideal position of each fiducial mark M and constitutes a position where each fiducial mark M should reside in red reference image R0. Next, image processing section 58 calculates correction amount ΔRS for aligning the position of each fiducial mark M recognized in S110 with reference position RMP of that fiducial mark M for each fiducial mark M (for each positional coordinate), and stores relevant correction amount ΔRS which is then associated with the red light source in storage section 59 (S140).

Figure 8A:
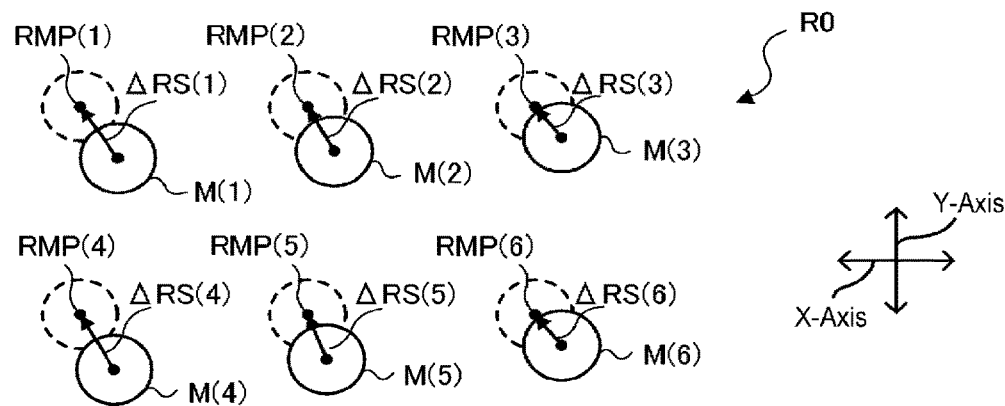
FIG. 8 An explanatory diagram showing an example of how to set a correction amount for each light source.

FIG. 8 is an explanatory diagram showing an example of how to set a correction amount of each light source, and FIG. 8(a) shows an example of how to set correction amount ΔRS corresponding to the red light source. In FIG. 8(a), fiducial marks M in red reference image R0 are indicated by a white circle of a solid line, and as an example, six fiducial marks (1) to (6) are shown. Additionally, reference positions RMP are indicated by a circle of a broken line, and reference positions RMP (1) to (6) corresponding, respectively, to fiducial marks (1) to (6) are shown. Respective correction amounts ΔRS (1) to ΔRS (6) of reference marks M (1) to (6) serve as correction amounts (refer to arrows) for matching the positions of fiducial marks M (1) to (6) recognized from red reference image R0 respectively to reference positions RMP (1) to (6), and also serve as movement amounts in the X-axis direction and the Y-axis direction, and the like.

Next, control section 57 causes mark camera 50 to image jig plate JP under illumination by the green light sources of epi-illuminating light source 52 and side illuminating light source 54 to acquire green reference image G0 (S150). Image processing section 58 recognizes respective positions of fiducial marks M from relative green reference image G0 so acquired (S160). Subsequently, image processing section 58 calculates separately correction amount ΔGS for aligning the position of each fiducial mark M with reference position RMP in red reference image R0 derived in S130 for each fiducial mark M (for each positional coordinate), and stores relevant correction amount ΔGS so calculated in storage section 59 while associating the correction amount with the green light source (S170).

Figure 8B:
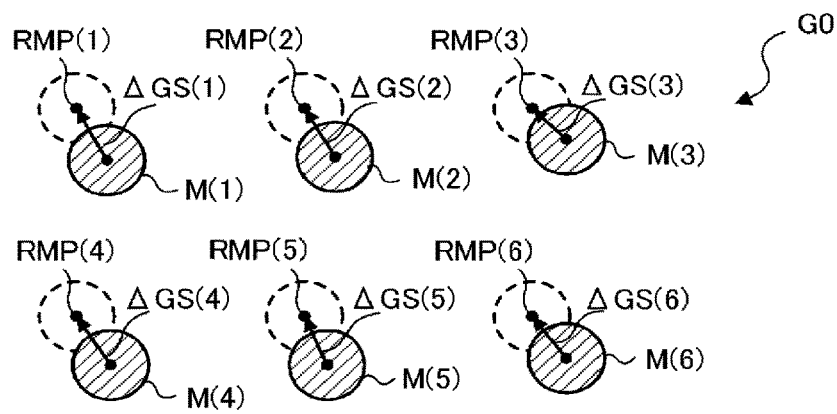

FIG. 8(b) shows an example of how to set correction amount ΔGS corresponding to the green light source, in which fiducial marks M (1) to (6) in green reference image G0 are indicated by a hatched circle of a solid line. Additionally, reference positions RMP (1) to (6) in red reference image R0 are illustrated. Correction amounts ΔGS (1) to ΔGS (6) are correction amounts (movement amounts in the X-axis direction and the Y-axis direction, and the like) for aligning the positions of fiducial marks M (1) to (6) which are recognized from green reference image G0 with reference positions RMP (1) to (6), respectively. That is, correction amount ΔGS for aligning the position of fiducial mark M recognized from green reference image G0 not with the reference position in green reference image G0 but with reference position RMP in red reference image R0 is set. Therefore, correction amount ΔGS becomes a correction amount that can correct not only the distortion aberration but also the chromatic aberration of the green light source so as to match red reference image R0.

Figure 8C:
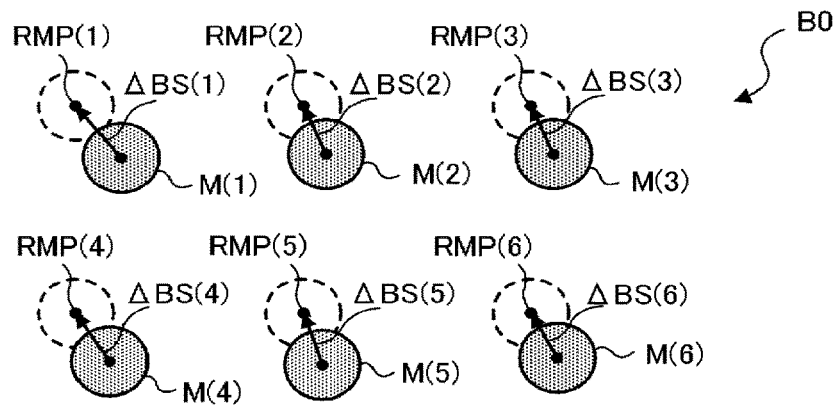

Subsequently, control section 57 causes mark camera 50 to image jig plate JP under illumination by the blue light sources (blue LEDs 52c and blue LEDs 54c) to acquire blue reference image B0 (S180). Image processing section 58 recognizes a position of each fiducial mark M from blue reference image B0 (S190). Subsequently, image processing section 58 calculates correction amount ΔBS for aligning the position of each fiducial mark M with reference position RMP in red reference image R0 derived in S130 for each fiducial mark M (for each positional coordinate) and stores relevant correction amount ΔBS so calculated in storage section 59 while associating the correction amount with the blue light source (S200). FIG. 8(c) shows an example of how to set correction amount ΔBS corresponding to the blue light source, and correction amount ΔBS of the blue light source is set in the same manner as in FIG. 8(b). That is, correction amount ΔBS for aligning the position of fiducial mark M recognized from blue reference image B0 not with the reference position in blue reference image B0 but with reference position RMP in red reference image R0 is set. Therefore, similarly to correction amount ΔGS of the green light source, correction amount ΔBS of the blue light source becomes a correction amount that can correct not only the distortion aberration but also the chromatic aberration of the blue light source so as to match red reference image R0. Mark camera 50 in which these correction amounts ΔRS, ΔGS, and ΔBS are stored in storage section 59 is assembled to head 40 of component mounter 10.

Next, an operation of component mounter 10 of the present embodiment which is configured as described above will be described. First, a component mounting process will be described. In a component mounting process, control section 61 of control device 60 first causes head moving device 30 to move suction nozzle 45 to a position lying above a component supply position of feeder 20 and causes head 40 to make suction nozzle 45 pick up a component. Next, control section 61 causes head moving device 30 to move head 40 to a position lying above a mounting position on board S by passing above part camera 23 and causes part camera 23 to image a component picked up and held by suction nozzle 45. Image processing section 62 image processes an image captured by part camera 23 to calculate a positional deviation amount of the component by recognizing an orientation thereof. Subsequently, control section 61 causes head 40 to mount the component in a mounting position corrected based on the positional deviation amount of the component. Control section 61 repeats this component mounting process to thereby mount predetermined number and types of components on board S.

Figure 9:
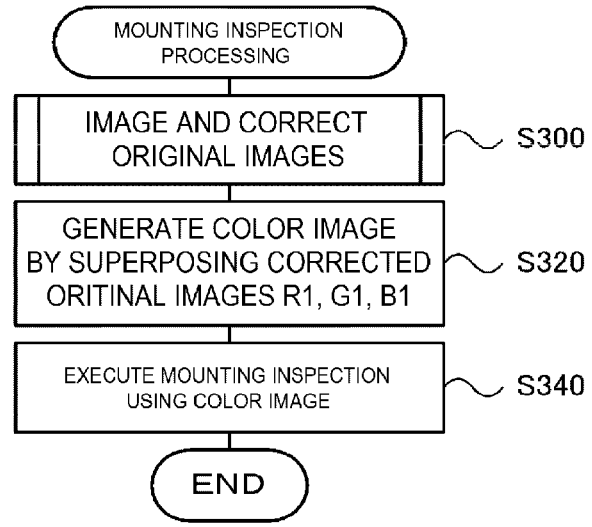
FIG. 9 A flowchart showing an example of mounting inspection processing.
Figure 10:
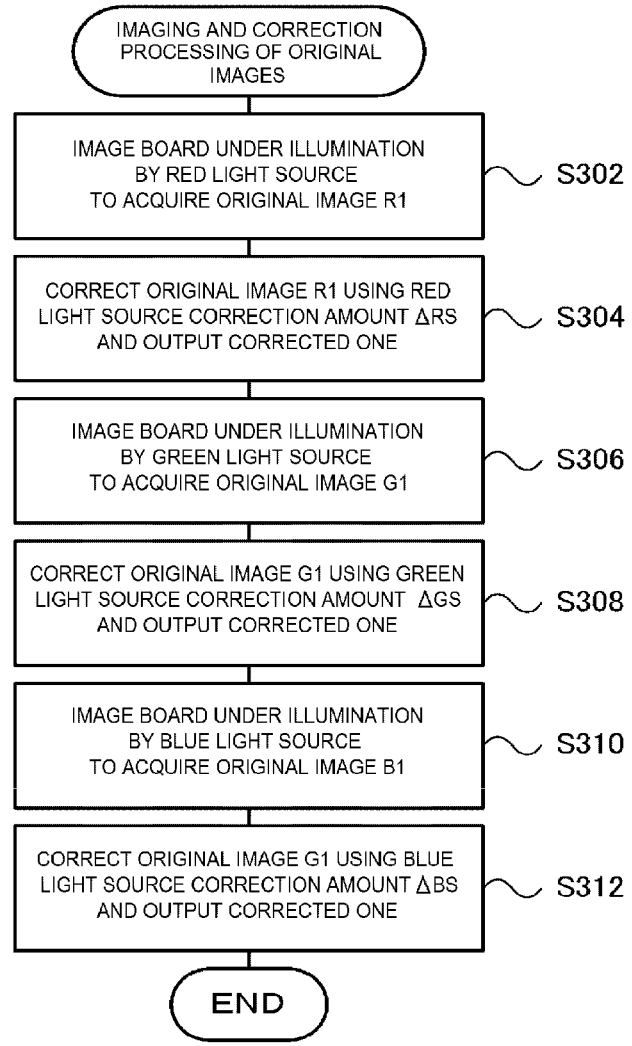
FIG. 10 A flowchart showing an example of imaging and correction processing of original images.

Next, a mounting inspection of components which is to be executed after component mounter 10 has completed the component mounting process will be described. FIG. 9 is a flowchart showing an example of mounting inspection processing. In the mounting inspection processing, control section 61 causes head moving device 30 to move mark camera 50 to a position lying above board S on which components are mounted and executes imaging and correction processing of original images which originate an image composition (S300). FIG. 10 is a flowchart showing an example of imaging and correction processing of original images.

In the imaging and correction processing of original images, control section 57 of mark camera 50 first causes mark camera 50 to image board S under illumination by the red light sources (red LEDs 52a and red LEDs 54a) to thereby acquire original image (monochromatic image) R1 (S302). Then, image processing section 58 corrects original image R1 by use of correction amount ΔRS stored in storage section 59 and outputs original image R1 so corrected to control section 61 (S304). Next, control section 57 causes mark camera 50 to image board S under illumination by the green light sources (green LEDs 52b and green LEDs 54b) to thereby acquire original image G1 (S306). Then, image processing section 58 corrects original image G1 by use of correction amount ΔGS stored in storage section 59 and outputs original image G1 so corrected to control section 61 (S308). Subsequently, control section 57 causes mark camera 50 to image board S under illumination by the blue light sources (blue LEDs 52c and blue LEDs 54c) to thereby acquire original image B1 (S310). Then, image processing section 58 corrects original image B1 by use of correction amount ΔBS of the blue light source stored in storage section 59 and outputs original image B1 so corrected to control section 61 (S312). By correcting original images R1, G1, and B1 by use of respective correction amounts ΔRS, ΔGS, and ΔBS of the light source colors, distortion aberration and chromatic aberration can be collectively corrected. Here, in the correction amount setting processing, in the case that the similar processing to that for red reference image R0 is executed for each of green reference image G0 and blue reference image B0 to thereby set correction amounts of distortion aberration and chromatic aberration for each light source color, distortion aberration and chromatic aberration are executed separately, whereby certain labor hours and time are taken for the corrections. In the present embodiment, since distortion aberration and chromatic aberration can collectively be corrected, the correction time can be shortened, whereby the mounting inspection can be executed by combining the color images quickly.

When original images R1, G1, B1 which are generated and corrected as described above are acquired, image processing section 62 superposes these original images R1, G1, B1 one on another to combine them together to thereby generate a color image (S320). Then, image processing section 62 executes a mounting inspection by use of the color image so generated (S340) and ends the mounting inspection processing. In the mounting inspection, image processing section 62 inspects whether the position of the component recognized from the color image is the mounting position of the component, or inspects whether a mounting deviation amount (a positional deviation amount and a rotational deviation amount) of the component stays within a permissible range. Since the distortion aberration and the chromatic aberration of each of original images R1, G1, B1 are appropriately corrected by use of correction amounts ΔRS, ΔGS, ΔBS described above, a superposition deviation in the combined color image can be suppressed. As a result, since an erroneous recognition of the position of a component due to the superposition deviation can be suppressed, the inspection precision of the mounting inspection can be improved.

Here, a correspondence between the constituent elements of the present embodiment and constituent elements of the present disclosure will be clarified. Storage section 59 of the present embodiment corresponds to a storage section, lighting section 50a including epi-illuminating light source 52 and side illuminating light source 54 corresponds to a light source section, camera main body section 50b including monochrome CCD 56 corresponds to an imaging section, image processing section 58 corresponds to a correction section, and control section 61 corresponds an inspection section. Additionally, mark camera 50 corresponds to an imaging device. Mark camera 50 and control device 60 correspond to an inspection device. In the present embodiment, an example of an image correction method of the present disclosure is also clarified by describing the operations of the imaging device and the inspection device.

With component mounter 10 described above, respective correction amounts $\Delta RS$, $\Delta GS$, $\Delta BS$ of R, G, B are stored in storage section 59 of mark camera 50. Correction amount $\Delta RS$ is set as the correction amount for correcting the position of fiducial mark M recognized from red reference image (a reference image of a specific light source color) R0 resulting from imaging jig plate JP under illumination by the red light sources to reference position RMP in red reference image R0. On the other hand, correction amounts $\Delta GS$, $\Delta BS$ are set as the correction amounts for correcting the positions of fiducial marks M recognized from green reference image G0 and blue reference image B0 which result from imaging jig plate JP under illumination by the green light sources and the blue light sources to reference position RMP in red reference image R0. Then, original images R1, G1, B1 of board Son which components are mounted are captured, and the distortion aberration and the chromatic aberration of each of original images R1, G1, B1 are collectively corrected using respective correction amounts $\Delta RS$, $\Delta GS$, $\Delta BS$. As a result, when compared with a case in which distortion aberration and chromatic aberration are separately corrected by use of respective correction amounts, the labor hours for correcting the distortion aberration and the chromatic aberration of each of original images R1, G1, B1 can be mitigated.

Additionally, in setting correction amount $\Delta RS$, the inclination of jig plate JP is calculated based on center position JPc of jig plate JP and the positions of fiducial marks M in red reference image R0, and reference position RMP is determined using the inclination and the ideal positions of fiducial marks M. As a result, correction amount $\Delta RS$ can be obtained by appropriately determining reference position RMP which reflects the inclination of jig plate JP. In addition, in setting other correction amounts $\Delta GS$, $\Delta BS$, since the positions of fiducial marks M only need be obtained without obtaining center position JPc and inclination of jig plate JP, those correction amounts can be set without any delay.

Additionally, with component mounter 10, since a color image is generated by superposing corrected original images R1, G1, B1 one on another and the mounting inspection of components is executed by use of the color image so generated, the mounting inspection of components can be executed accurately based on the color image with less deviation in which distortion aberration and chromatic aberration are suppressed.

Needless to say, the present disclosure is not limited in any way by the embodiment that has been described heretofore, and hence, the present disclosure can be carried out in various manners without departing from the technical scope of the present disclosure.

For example, in the embodiment described above, reference position RMP, being used in setting correction amount $\Delta RS$ of the red light source, is also used in setting the correction amount $\Delta GS$ of the green light source and the correction amount $\Delta BS$ of the blue image. That is, although red reference image R0 is used as the reference image of a specific light source color, the present disclosure is not limited thereto, and hence, green reference image G0 may be used as the reference image of a specific light source color, or blue reference image B0 may also be so used.

In the embodiment described above, correction amounts $\Delta RS$, $\Delta GS$, $\Delta BS$ for aligning the position of each fiducial mark M with reference position RMP of each fiducial mark M are calculated separately for each fiducial mark M and are stored in storage section 59; however, the present disclosure is not limited thereto. A configuration may be adopted in which after correction amounts $\Delta RS$, $\Delta GS$, $\Delta BS$ of fiducial marks M of the reference images of the three colors are calculated, a correction amount of each positional coordinate at a finer pitch in the reference image of each of the three colors is calculated through interpolation using a correction amount of adjacent fiducial mark M for storage in storage section 59. In the reference image of each of the three colors, a configuration may be adopted in which the correction amount is further calculated through interpolation using the correction amount of each positional coordinate so calculated, and finally, a correction amount of each pixel is calculated for storage in storage section 59.

In the embodiment described above, image processing section 58 of mark camera 50 corrects original images R1, G1, B1 using correction amounts $\Delta RS$, $\Delta GS$, $\Delta BS$, respectively; however, the present disclosure is not limited thereto, and hence, control section 61 of control device 60 may be configured to execute the corrections. As this occurs, storage section 59 of mark camera 50 may store correction amounts $\Delta RS$, $\Delta GS$, $\Delta BS$, and storage section 63 of control device 60 may store correction amounts $\Delta RS$, $\Delta GS$, $\Delta BS$.

In the embodiment described above, original images R1, G1, B1 of the three colors of R, G, B are described as being combined together; however, the present disclosure is not limited thereto, and hence, the original images of any two or more colors in those three colors or two or more colors including other colors only need be combined together. Even in the case of two colors, a correction amount only need be set for one of the two colors as a specific light source color.

In the embodiment described above, the color image is described as being generated to inspect board S on which components are mounted; however, the present disclosure is not limited thereto. Depending on the color, material, shape, or the like of board S or a component constituting an inspection target, there may be a case in which image processing section 62 can execute a mounting inspection using not a color image but only any of original images (monochromatic images) R1, G1, B1. Even in the case that no color image is used in the mounting inspection as described above, image processing section 62 may generate a color image by combining the original images together, and control section 61 may display the color image so generated on a display device, not shown, of component mounter 10. The operator can easily recognize a status of the inspection target as a result of the color image being displayed on the display device.

In the embodiment described above, mark camera 50 is described as including integrally lighting section 50a having the light sources of three colors of R, G, B (LEDs 52a to 52c, 54a to 54c) and camera main body section 50b having monochrome CCD 56; however, the present disclosure is not limited thereto. For example, lighting section 50a and camera main body section 50b may be configured separately.

In the embodiment described above, component mounter 10 is described as doubling as the inspection device; however, the present disclosure is not limited thereto, and hence, an exclusive inspection device may be provided downstream of component mounter 10 in the board conveyance direction in the production line.

In the embodiment described above, the color image is described as being generated for inspecting the board on which the components are mounted; however, the present disclosure is not limited thereto. A color image for inspecting solder of board S may be generated before components are mounted, or a color image for recognizing a component supplied by feeder 20 may be generated. Additionally, although mark camera 50 is described as including the inspection device; however, the inspection device may be provided on another imaging device such as part camera 23. In addition, the application of the inspection device is not limited to inspection of mounting of a component, and hence, the inspection device may be applied to an inspection using a composite image resulting from combining original images of the three colors. One or multiple computers may be configured to execute the image correction method of the present disclosure, and for example, the image processing device configured as the general-purpose computer may execute the image correction method of the present disclosure.

Here, an image correction method of the present disclosure may be configured as follows. For example, in an image correction method of the present disclosure, a configuration may be adopted in which in the step (a), the center position of the member and the position of the fiducial mark in the reference image of the specific light source color are recognized, the inclination of the member is derived based on the center position and the position of the fiducial mark, and the reference position in the reference image of the specific light source color is determined using the inclination of the member so derived and the ideal position of the fiducial mark to thereby obtain the correction amount, and in the step (b), the position of the fiducial mark is recognized for each of the reference images of the other light source colors to thereby obtain the correction amount. As a result, the reference position of the fiducial mark in the reference image of the specific light source color is determined appropriately by causing the ideal position of the fiducial mark to reflect the inclination of the member provided with the fiducial mark, thereby making it possible to obtain a correction amount. In addition, in obtaining correction amounts of the other light source colors, the position of the fiducial mark of each of the reference images of the other light source colors only need be recognized, and the center position of the member or the like need not be recognized, whereby the correction amounts can be obtained quickly.

To summarize, an imaging device of the present disclosure includes a storage section configured to store the correction amounts set using either of the image correction methods described above while associating the correction amounts with individual light source colors, a light source section configured to irradiate multiple different light source colors, an imaging section configured to capture original images making up a composite image under illumination by the multiple different light source colors, and a correction section configured to correct collectively distortion aberration and chromatic aberration of the original images of the individual light source colors using the correction amounts associated with the individual light source colors.

Since the imaging device of the present disclosure corrects the distortion aberration and chromatic aberration of the original images of the individual light source colors using the correction amounts set by either of the image correction methods described above, as with the image correction method described above, the labor hours required to correct the distortion aberration and chromatic aberration of the original images can be mitigated so as to generate the composite image without any delay.

To summarize, an inspection device of the present disclosure includes a storage section configured to store the correction amounts set using either of the image correction methods described above while associating the correction amounts with individual light source colors, a light source section configured to irradiate multiple different light source colors, an imaging section configured to image a board on which components are mounted as original images under illumination by the individual light source colors, a correction section configured to, when the original images are captured, correct collectively distortion aberration and chromatic aberration of the original images of the individual light source colors using the correction amounts associated with the individual light source colors, and an inspection section configured to generate a composite image by superposing the original images whose distortion aberration and chromatic aberration are corrected to thereby execute a mounting inspection of the components based on the composite image so generated.

Since the inspection device of the present disclosure corrects collectively the distortion aberration and chromatic aberration of the original images of the individual light source colors using the correction amounts set using either of the image correction methods described above, as with the image correction method described above, the labor hours required to correct the distortion aberration and chromatic aberration of the original images can be mitigated so as to generate the composite image without any delay. In addition, the component mounting inspection can accurately be executed based on the composite image.

INDUSTRIAL APPLICABILITY

The present disclosure can be applied to a manufacturing industry of imaging devices, inspection devices, and component mounters, and the like.

REFERENCE SIGNS LIST 10 component mounter, 11 base plate, 12 housing, 20 feeder, 21 reel, 22 board conveyance device, 23 part camera, 30 head moving device, 31 X-axis guide rail, 32 X-axis slider, 33 X-axis actuator, 35 Y-axis guide rail, 36 Y-axis slider, 37 Y-axis actuator, 40 head, 41 Z-axis actuator, 42 θ-axis actuator, 45 suction nozzle, 50 mark camera, 50a lighting section, 50b camera main body section, 51 housing, 52 epi-illuminating light source, 52a red LED, 52b green LED, 52c blue LED, 52d support plate, 53 half mirror, 54 side illuminating light source, 54a red LED, 54b green LED, 54c blue LED, 54d support plate, 55 diffusion plate, 56 monochrome CCD, 57 control section, 58 image processing section, 59 storage section, 60 control device, 61 control section, 62 image processing section, 63 storage section, S board

The invention claimed is:

1. An image correction method for correcting multiple original images captured under illumination by multiple different light source colors in generating a composite image by superposing the original images, the image correction method comprising:
   (a) a step of obtaining a correction amount for correcting a position of a fiducial mark recognized from a reference image of a specific light source color in reference images of the multiple different light source colors resulting from imaging a member on which the fiducial mark is provided under illumination by the multiple different light source colors to a reference position of the fiducial mark in the reference image of the specific light source color and setting the correction amount by associating the correction amount with the specific light source color;
   (b) obtaining correction amounts for correcting positions of the fiducial mark recognized from the reference images of other light source colors than the specific light source color to the reference position in the reference image of the specific light source color for the other light source colors and setting the correction amounts by associating the correction amounts with the other light source colors; and
   (c) when the original images are captured, correcting collectively distortion aberration and chromatic aberration of the original images of the multiple different light source colors using the correction amounts associated with the multiple different light source colors.

2. The image correction method according to claim 1, wherein in the step (a), the center position of the member and the position of the fiducial mark in the reference image of the specific light source color are recognized, an inclination of the member is derived based on the center position and the position of the fiducial mark, and the reference position in the reference image of the specific light source color is determined using the inclination of the member so derived and an ideal position of the fiducial mark to thereby obtain the correction amount, and wherein in the step (b), the position of the fiducial mark is recognized for each of the reference images of the other light source colors to thereby obtain the correction amount.

3. An imaging device comprising:
   a storage section configured to store the correction amounts set using the image correction method according to claim 1 while associating the correction amounts with individual light source colors;
   a light source section configured to irradiate multiple different light source colors;
   an imaging section configured to capture original images making up a composite image under illumination by the multiple different light source colors; and
   a correction section configured to correct collectively distortion aberration and chromatic aberration of the original images of the individual light source colors using the correction amounts associated with the individual light source colors.

4. An inspection device comprising:
   a storage section configured to store the correction amounts set using the image correction method according to claim 1 while associating the correction amounts with individual light source colors;
   a light source section configured to irradiate multiple different light source colors;
   an imaging section configured to image a board on which components are mounted as original images under illumination by the individual light source colors;
   a correction section configured to, when the original images are captured, correct collectively distortion aberration and chromatic aberration of the original images of the individual light source colors using the correction amounts associated with the individual light source colors; and
   an inspection section configured to generate a composite image by superposing the original images whose distortion aberration and chromatic aberration are corrected to thereby execute a mounting inspection of the components based on the composite image so generated.

* * * * *